United States Patent [19]
Nelson et al.

[11] Patent Number: 4,592,986
[45] Date of Patent: Jun. 3, 1986

[54] MAGNETIC BRUSH ABRASION DEVELOPMENT OF IMAGING SHEETS EMPLOYING PHOTOSENSITIVE MICROCAPSULES

[75] Inventors: Erik K. Nelson, Centerville; Joseph G. O'Connor; David A. Boyer, both of Chillicothe; Edward J. Saccocio, Columbus, all of Ohio

[73] Assignee: The Mead Corporation, Dayton, Ohio

[21] Appl. No.: 711,779

[22] Filed: Mar. 14, 1985

[51] Int. Cl.⁴ ............................................. G03G 13/22
[52] U.S. Cl. ....................................... 430/98; 430/138; 118/657
[58] Field of Search ................... 355/27, 100; 430/98, 430/97; 118/657

[56] References Cited

U.S. PATENT DOCUMENTS 4,307,169 12/1981 Matkan ................................. 430/122
4,450,221 5/1984 Terada et al. ......................... 430/98

Primary Examiner—John L Goodrow
Attorney, Agent, or Firm—Biebel, French & Nauman

[57] ABSTRACT

Imaging sheets having a coating containing chromogenic material and a photosensitive composition with at least the photosensitive composition encapsulated in rupturable microcapsules as an internal phase are processed by contacting the imaging sheets with a traveling pile formed by magnetically attractable free particles on a magnetic brush to rupture the microcapsules coating the surfaces of the imaging sheets by means of a soft pliable brushing action of the pile against the imaging sheets.

16 Claims, 7 Drawing Figures

MAGNETIC BRUSH ABRASION DEVELOPMENT OF IMAGING SHEETS EMPLOYING PHOTOSENSITIVE MICROCAPSULES

BACKGROUND OF THE INVENTION

The present invention relates generally to an imaging system utilizing imaging sheets having a surface coating of rupturable photosensitive microcapsules and, more particularly, to a method and apparatus for processing such imaging sheets.

U.S. Pat. Nos. 4,440,846 and 4,399,209, which are assigned to The Mead Corporation and hereby incorporated by reference, describe an imaging system wherein a photosensitive layer comprising microcapsules containing a photosensitive composition in the internal phase is image-wise exposed to actinic radiation and subjected to a uniform rupturing force whereupon the microcapsules rupture and image-wise release the internal phase. The imaging system is particularly advantageous because it is a totally dry system and does not rely upon the application of wet development processing solutions to produce the image. An image-forming chromogenic material, such as a substantially colorless color former, is typically associated with the microcapsules. When the microcapsules rupture, the color former image-wise reacts with a developer material and produces a color image. In the embodiments described in the referenced patents, the microcapsules are typically ruptured by passing image-wise exposed imaging sheets through the nip between a pair of calender rollers.

While heavy pressure is not required to rupture the microcapsules, high pressure and large calender rollers are normally used to develop the imaging sheets. Even carefully machined metal calender rollers have uneven surfaces. If one roller is simply rested upon another, the surfaces of the rollers are not in contact over the entire length of the rollers. By applying pressure to the rollers, the uneven surfaces or surface irregularities are "smoothed out" to provide a uniform contact line between the rollers. The high pressure and large size of the rollers are necessary to achieve a uniform distribution of the rupturing force across the surface of the imaging sheets. If the rupturing force is not uniformly distributed, the imaging sheets develop unevenly and the tonal characteristics of the resulting images are not good.

As the width of the imaging sheets and the corresponding length of the calender rollers increases, the diameter of the rollers must also be increased to maintain sufficient stiffness such that pressure applied to the ends of the rollers is distributed evenly across the entire expanse of the rollers. As a general rule, as the length of the rollers is doubled, the diameter of the rollers must be doubled in order to maintain sufficient stiffness. Thus, as the size of the imaging sheets increases, the cost and size of effective pressure type development apparatus becomes prohibitive. In particular, while larger pressure rollers may be accommodated in development apparatuses designed to develop relatively small copies, e.g., 8 to 12 inches in width, in certain applications such as color proofing, large copy widths, sometimes in excess of 36 inches, are used. These copies are so large as to make it impractical to develop them using pressure rollers.

An additional drawback of pressure processing imaging sheets is that when high pressures are applied to the calender rollers, as required to overcome surface irregularities and achieve uniform development across the rollers, some of the midtone quality of the developed images is lost. This is apparently due to a loss of a differential microcapsule rupture and is referred to as "midtone mottle". Thus, a number of difficulties have been encountered in designing pressure type development apparatus for the aforementioned imaging sheets.

An improved arrangement for processing imaging sheets without high pressure and bulky calender rollers is disclosed in commonly assigned U.S. Pat. No. 4,448,516, which is hereby incorporated by reference. In this patent, the imaging sheets are passed over a developer roll having a fibrous outer surface composed of interwoven natural or synthetic fibers or flexible bristles. The developer roll is rotated in contact with the imaging sheets to rupture the microcapsules on the sheets. The developer roll is an improvement over the bulky high pressure calender rollers and has advantages over the alternative proposals disclosed in the first referenced patents.

Unfortunately, the fibrous outer surface of the developer roll of the last referenced patent has limited microcapsule engaging surface area. Accordingly, as imaging sheets are processed by the developer roll to rupture the microcapsules on the sheets, oil released from the ruptured microcapsules accumulates on the limited surface area of the developer roll. After a given amount of oil accumulation, background coloring (fog) begins to increase on processed imaging sheets. Since background coloring detracts from the developed image, the developer rolls must be frequently changed to maintain high quality images.

New alternatives which offer inexpensive techniques for developing imaging sheets, overcome deficiencies of the prior art and may be preferred for selected applications are in demand and serve to advance the art of imaging systems utilizing the imaging sheets of the first referenced patents.

SUMMARY OF THE INVENTION

The term "microcapsule" as used herein refers to both microcapsules having a discrete microcapsule wall and microcapsules formed in a so-called open phase system wherein the internal phase constituents are simply dispersed in a binder.

The term "photosensitive composition" means a composition which changes viscosity upon exposure to actinic radiation.

The term "chromogenic material" refers to the color forming reactant which is encapsulated or otherwise associated with the microcapsules. The term "developer" refers to the reactant not associated with the microcapsules.

In accordance with the present invention, imaging sheets are processed by contacting the imaging sheets with a traveling pile formed by magnetically attractable free particles on a magnetic brush. In its broadest sense, the present invention relates to a method and apparatus for rupturing the microcapsules which form a photosensitive layer of the aforementioned imaging sheets by forming a body of magnetically attractable free particles, positioning a magnetic brush over the particles, operating the brush and passing an imaging sheet over the resulting pile of free particles traveling upon the magnetic brush such that the pile of free particles moves over the microcapsules on the surface of the imaging sheet and thereby abrades and ruptures the microcapsules.

The latent image in the imaging sheet is developed if the microcapsules are ruptured in the presence of a developer. A developer can be provided as a coating on the imaging sheet itself or may be intermixed with the body of free particles such that as the microcapsules are ruptured, the developer and a chromogenic material, such as a colorless color former, interact and form the image. As a further alternative, the microcapsules can be ruptured by contacting the magnetic brush generated pile of free particles and the developer can be applied later.

Preferably, the direction of travel of the pile formed on the magnetic brush is the same as the direction of travel of the imaging sheet along the area of contact between the imaging sheet and the magnetic brush pile. In one embodiment of the present invention, an imaging sheet may be passed over the traveling pile of the magnetic brush by mounting a cylinder for rotation in alignment with the magnetic brush and spaced a desired distance therefrom, securing the sheet to the cylinder and rotating the cylinder to contact the microcapsules on the surface of the sheet with the traveling pile of free particles on the magnetic brush. Alternately, a chute may be formed along and preferably conformal with at least a portion of the magnetic brush such that an imaging sheet may be inserted into the chute with the microcapsules on the surface of the sheet contacting a traveling pile of free particles on the magnetic brush. An imaging sheet may be drawn through the chute by the action of the traveling pile on the magnetic brush or independent sheet transporting means may be associated with the chute.

A suitable magnetic brush for use in the present invention comprises at least one non-magnetic sleeve which is engaged with the body of magnetically attractable free particles. A magnetized device is disposed within the sleeve and drive means are provided for producing relative movement between the magnetized device and the sleeve. Preferably, the sleeve is rotated to produce a traveling pile of magnetically attractable free particles upon the surface of the sleeve. When a sheet supporting cylinder is utilized in the present invention, sheet stabilizing means are provided for securing the sheet to the cylinder. Sheet stabilizing means range from mechanical clips to preferred vacuum systems.

In each of the magnetic brush developing systems, the developer can be carried on the imaging sheet, can be intermixed with the body of magnetically attractable free particles and, hence, applied from the body of free particles or can be applied separately after the microcapsules are ruptured. In one embodiment of the last mentioned arrangement for developing a latent image, a second sheet processing stage is provided wherein a body of developer particles is formed, a developer magnetic brush is operably engaged with the body of developer particles for forming a moving pile of the developer particles over the developer magnetic brush, and the sheet handling means further provides for passing an imaging sheet over the developer magnetic brush after the microcapsules have been ruptured such that the moving pile of developer particles is applied to the imaging sheet and the chromogenic material interacts with applied developer to develop the latent image.

It is, therefore, an object of the present invention to provide a method and apparatus for processing imaging sheets by means of a magnetic brush such that microcapsules on imaging sheets are contacted by a traveling or moving pile of magnetically attractable free particles formed on the magnetic brush to thereby subject the microcapsules to a uniform rupturing force such that chromogenic material associated with the microcapsules can interact with a developer and thereby develop latent images in the imaging sheets.

Other objects and advantages of the invention will be apparent from the following description, the accompanying drawings and the appended claims.

DETAILED DESCRIPTION OF THE INVENTION

Figure 1A:
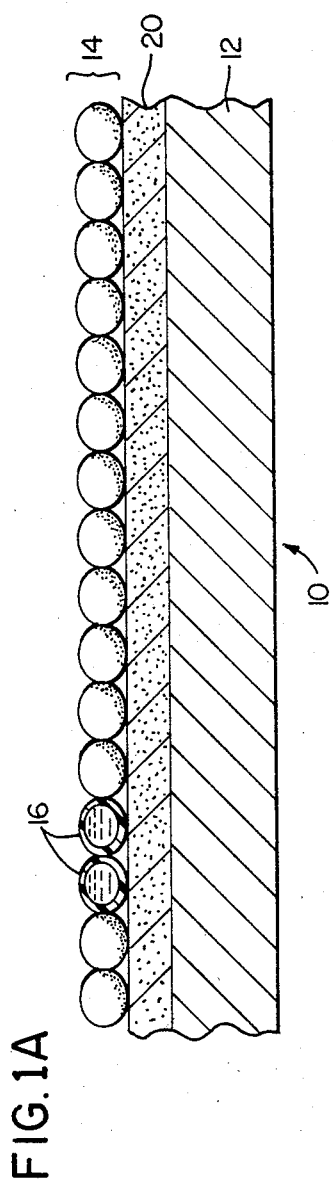
FIGS. 1A and 1B show a self-contained imaging sheet and formation of a latent image in the imaging sheet which is then processed in accordance with the present invention.
Figure 2A:
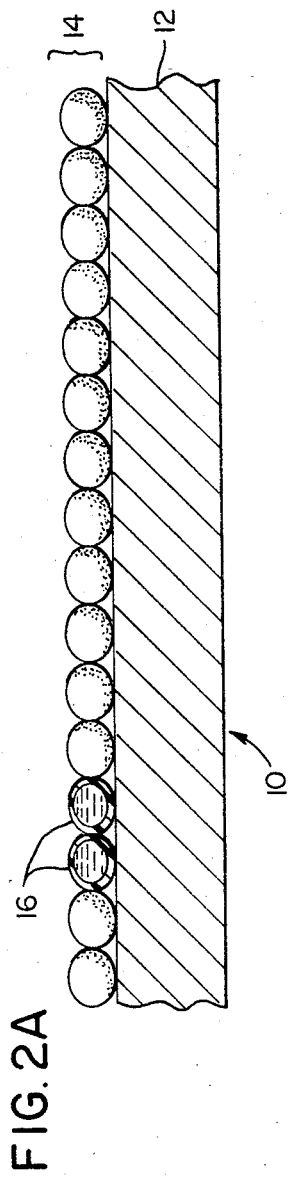
FIGS. 2A and 2B show a transfer imaging sheet and the formation of a latent image in the imaging sheet which is then processed in accordance with the present invention.

FIGS. 1A and 2A illustrate embodiments of the imaging sheets in accordance with referenced U.S. Pat. Nos. 4,440,846 and b 4,399,209, respectively. Therein, an imaging sheet 10 is constituted by a substrate 12 coated with a layer of microcapsules 14. The microcapsules 14 are filled with an internal phase 16 containing a photosensitive composition. Usually, the microcapsules 14 also contain chromogenic material; however, the chromogenic material can be associated with the microcapsules 14 in other ways, such as by incorporation into the microcapsule wall or in a layer contiguous with the microcapsules.

In actuality, the microcapsules 14 are not visible to the unaided eye since the mean size of the microcapsules generally ranges from approximately 1-25 microns. In the imaging sheet 10, shown in FIG. 1A, a layer of developer material 20 is interposed between the layer of microcapsules 14 and the substrate 12.

Figure 1B:
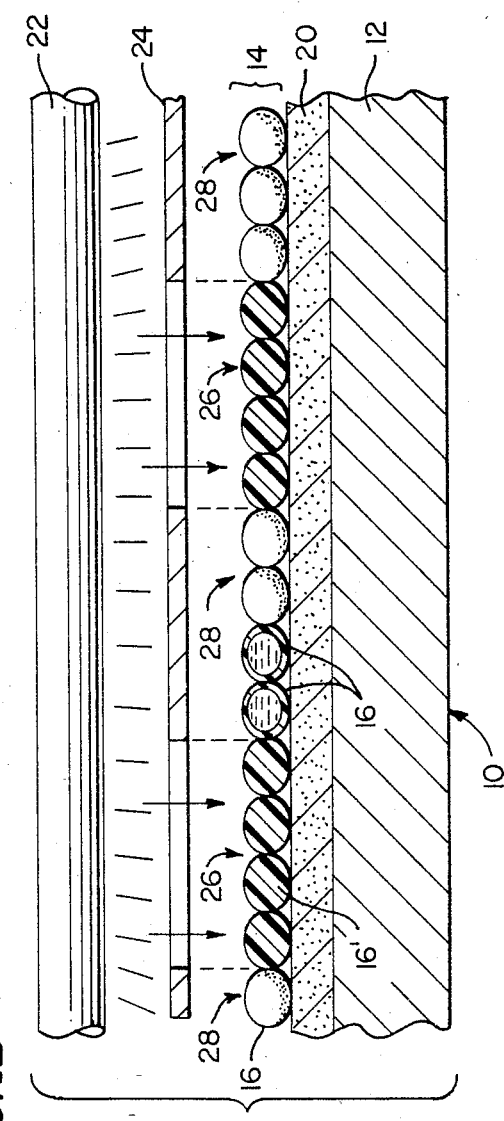
Figure 2B:
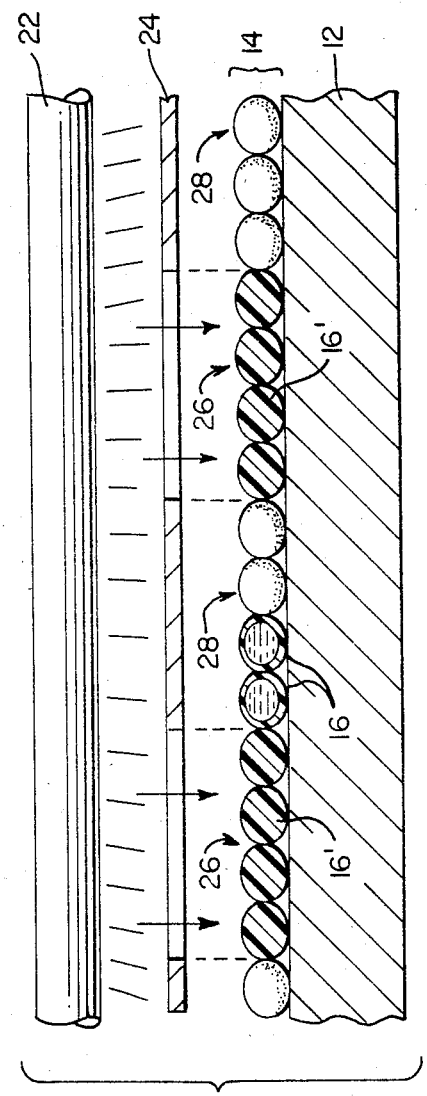

Exposure of the imaging sheets 10 by transmission imaging is shown in FIGS. 1B and 2B wherein a source of radiant energy 22 is positioned above the surface of the imaging sheets 10 with a mask 24 positioned therebetween. In the illustrations of FIGS. 1 and 2, the substrate 12 is opaque and the photosensitive material within the microcapsules 14 is a positive working radiation curable material, i.e., the viscosity of the material increases upon exposure to actinic radiation.

The radiation of the exposed areas 26 causes the radiation curable composition in the internal phase 16 of the microcapsules 14 to polymerize thereby gelling, solidifying or otherwise immobilizing the chromogenic material and preventing the chromogenic material from reacting with the developer material. To simplify the illustration, internal phase 16' in the exposed areas 26 is shown as a solid; whereas, the internal phase 16 remains liquid in the unexposed areas 28.

The imaging sheets 10 are processed in accordance with the present invention by introducing the imaging sheets to a traveling or moving pile of magnetically attractable free particles formed on a magnetic brush to rupture the microcapsules 14 such that the chromogenic material contained within the microcapsules 14 or otherwise associated therewith can interact with a developer. The microcapsules 14 are primarily ruptured by shear forces parallel to the surface of the imaging sheets due to the relative movement of the imaging sheets and the traveling or moving pile of magnetically attractable free particles formed on the magnetic brush.

As imaging sheets are processed by the magnetic brush of the present invention to rupture the microcapsules on the sheets, the oil released from the ruptured microcapsules tends to accumulate on the magnetically attractable free particles which form the traveling pile of the magnetic brush. After a given amount of oil accumulation on the particles, background coloring (fog) begins to appear. Accordingly, after a number of sheets have been developed utilizing a given body of free particles, the free particles must be replaced.

The traveling or moving pile formed of magnetically attractable free particles on a magnetic brush presents an effective surface area equal to the surface area of all the individual free particles. This effective surface area of the moving pile of the magnetic brush greatly exceeds the surface area presented by the developer roll of referenced U.S. Pat. No. 4,448,516. Accordingly, the time between changing the body of free particles is much greater than the time between required changes of such developer rolls.

Figure 4:
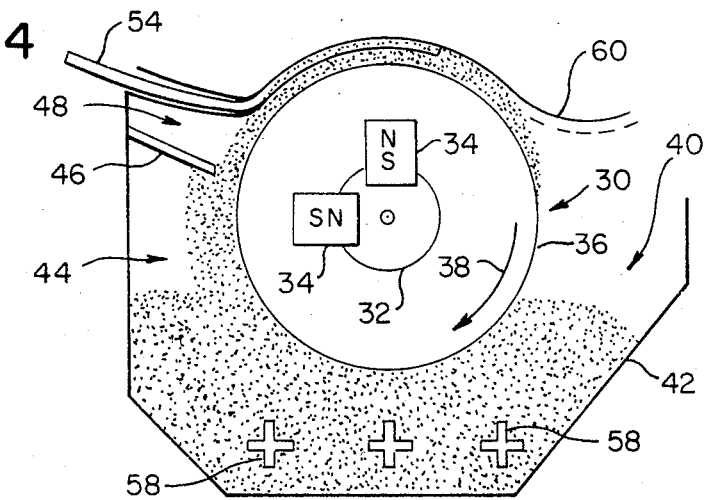
Figure 5:
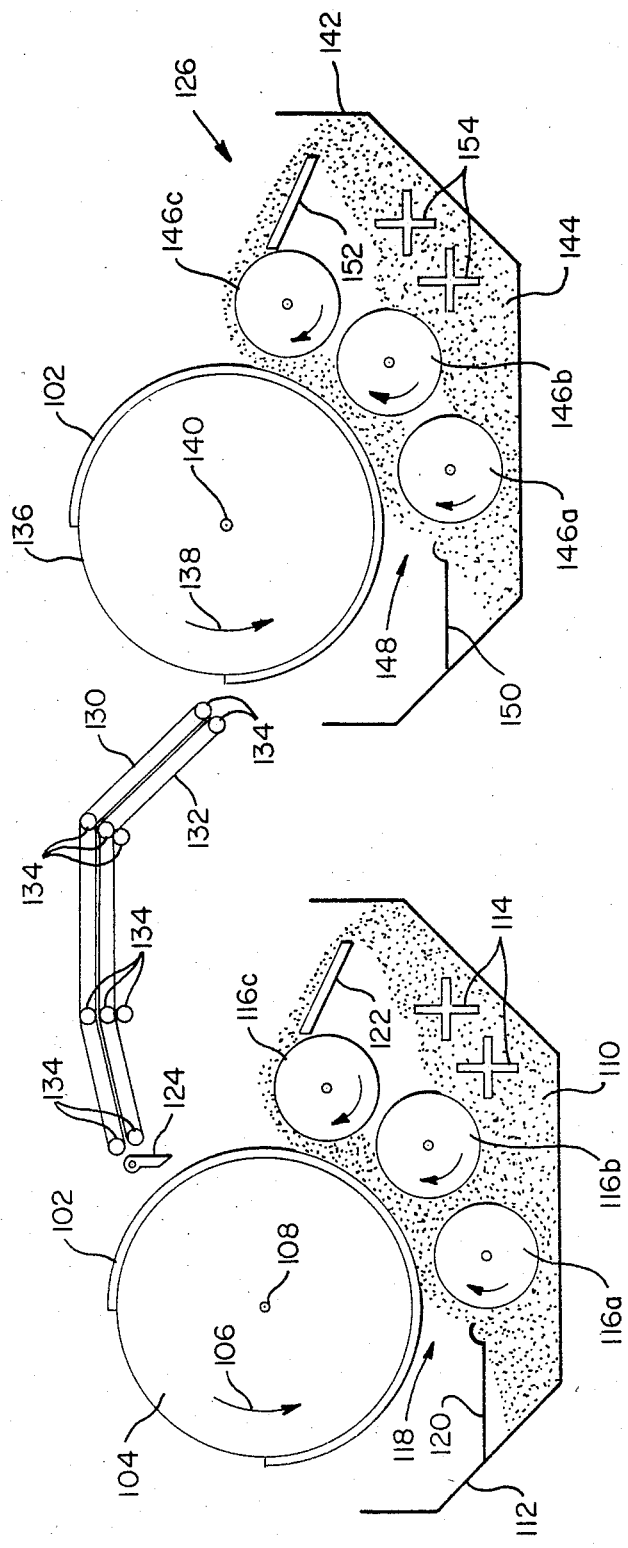

A large variety of magnetic brush designs are known for use in xerographic machines. Such magnetic brushes are conventionally used to carry toner particles into contact with a charge pattern bearing member, such as a sheet of copy paper, to deposit toner particles onto the member and thereby form an image. Accordingly, a simple magnetic brush design is shown in FIGS. 3-5 for ease of illustration and description; however, it is to be understood that a large variety of magnetic brushes may be utilized in accordance with the present invention.

Figure 3:
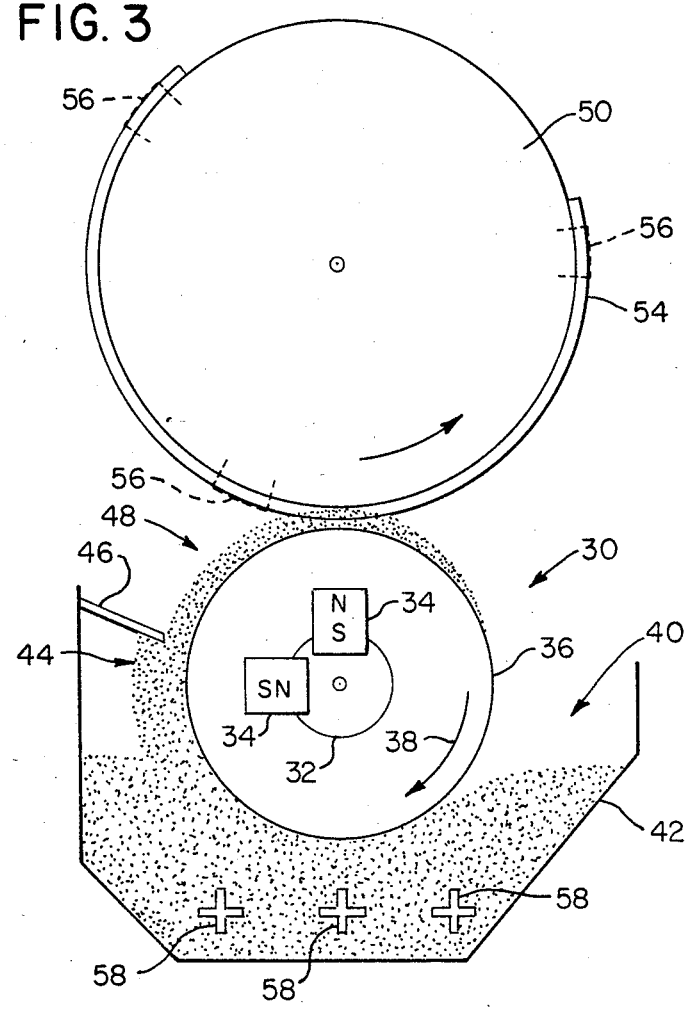
FIGS. 3-5 are schematic cross-sectional views of illustrative embodiments of apparatus for processing imaging sheets in accordance with the present invention.

FIG. 3 shows a schematic cross-sectional view of a first illustrative embodiment of apparatus for processing imaging sheets in accordance with the present invention. A magnetic brush 30 includes a fixed shaft 32 having at least one pair of magnets 34 fixed thereto. The shaft 32 is situated within a cylindrical sleeve 36 which is rotated in the clockwise direction in the illustrative embodiment as indicated by an arrow 38. The sleeve 36 engages a body of magnetically attractable free particles 40 which is held within a sump or trough 42 which is axially aligned with the magnetic brush 30. It is noted that other designs of magnetic brushes maintain an outer sleeve fixed and rotate an inner magnetized member to form a traveling pile on the outer sleeve.

The presently preferred material for making the particles is iron, although various other magnetically attractable particles may also be used. The recommended particle sizes range from about 0.08 to 0.2 millimeters. The particles 40 are preferably round in shape as opposed to being irregularly or angularly shaped. It is also desirable to coat the particles 40 with various polymers. In the case of iron particles, the coating prevents rust. Such coating also appears to increase friction and to repel the oil that is released from the microcapsules 14 upon rupture. For the noted microcapsules' size range of 1-25 microns, preliminary results indicate that nearly round, approximately 0.10 millimeter in diameter iron balls coated with a vinyl polymer are preferred.

As the sleeve 36 is rotated, the particles 40 stand up in trees or bristle-like formations to form a pile 44 on the outer surface of the sleeve 36. The pile 44 formed on the sleeve 36 rotates in the clockwise direction with the sleeve 36 as indicated by the arrow 38 into engagement with a trim blade or doctor blade 44 which is adjusted to define the length of the pile 48 on the section of the magnetic brush 30 which is to engage an imaging sheet. An exposed imaging sheet is passed over the pile 48 on the magnetic brush 30 and is contacted by the pile 48 such that the microcapsules on the surface of the imaging sheet are ruptured and release their internal phase.

An imaging sheet may be placed in contact with the pile of the magnetic brush in a variety of ways. In accordance with one embodiment of the present invention, an imaging sheet carrier cylinder 50 is mounted for rotation about an axis 52 parallel to the magnetic brush 30 with the cylinder 50 being sized and positioned such that the pile 48 traveling on the magnetic brush 30 is just slightly greater than the gap between the sleeve 36 and the cylinder 50. The imaging sheet carrier cylinder 50 can be operated in the same or opposite direction as that of the moving pile on the magnetic brush 30. However, it is preferred that imaging sheet 54 secured to the outer surface of the cylinder 50 travel in the same direction as the pile 48 on the magnetic brush 30 and the magnetic brush 30 rotate at a higher tangential velocity than cylinder 50 such that the pile 48 sweeps along the imaging sheet 54.

The imaging sheet 54 may be secured to the cylinder 50 by sheet stabilizing means comprising clips 56 or preferably by means of vacuum systems well known in the art. The particles 40 are deposited back to the trough 42 as the cylinder 36 is rotated such that the particles 40 are continuously recirculated to form the pile 48 of the brush 30. It may be desirable to provide particle agitation means within the trough 42, such as stirrers 58, as shown.

A number of factors influence the developing of imaging sheets utilizing a magnetic brush. Initially, the strength of the magnetic fields of the magnets 34 must be properly selected to provide a desired pile texture on the magnetic brush 30. If the magnetic field is too strong, the magnetic trees or fibers become too stiff much like a wire brush and, hence, may abrade the surface of an imaging sheet too harshly. Accordingly, the magnetic fields must be selected such that they produce a pile which causes a soft, pliable brushing action against the surface of an imaging sheet. Such a soft, pliable brushing action also gives a more randomized contact with the imaging sheet which is desirable since even rupturing forces must be applied to the imaging sheet and cannot be applied in well defined lines as might well be the case if a stronger magnetic field was applied.

In accordance with a first alternate embodiment, the imaging sheet carrier cylinder 50 is replaced by chute means or a channel 60 formed along and preferably conformal with at least a portion of the pile 48 of the magnetic brush 30 such that the imaging sheet 54 may be inserted into the chute or channel 60 with the microcapsules on the surface of the sheet 54 contacting the traveling pile of free particles on the magnetic brush 30. An imaging sheet may be drawn through the channel 60 by the action of the traveling pile on the magnetic brush 30 or independent sheet transporting means (not shown) may be associated with the chute. Use of the channel 60 may be preferred over the cylinder 50 in some applications since it increases the surface area of an imaging sheet in contact with the pile of a magnetic brush and, accordingly, increases the developing action. Alternate arrangements for contacting an imaging sheet with the traveling pile of a magnetic brush in addition to the illustrated carrier cylinder and chute as will be suggested to those skilled in the art by this disclosure.

In accordance with the present invention, a magnetic brush is used to develop latent images formed in imaging sheets by rupturing the microcapsules coated on an imaging sheet such that chromogenic material encapsulated in or associated with the microcapsules can interact with a developer. In the case of the self-contained imaging sheets, as shown in FIGS. 1A and 1B, the developer is on the same surface of the sheet as the microcapsules and upon rupturing the microcapsules, the internal phase migrates to the developer layer where it reacts to develop the latent image.

It has been found that when a magnetic brush is used to develop such imaging sheets, it may be desirable to use a somewhat thinner coating of microcapsules on the sheet than is typically the case. The shear action appears to be restricted to the surface of the microcapsule layer. Accordingly, if the layer is too thick, unruptured microcapsules may tend to isolate the surface from the underlying developer composition and thereby prevent development.

The gap between an imaging sheet and the rotating sleeve of the magnetic brush is also important as is the length of the pile formed on the magnetic brush vis-a-vis the size of the gap. These factors determine how much shear force is applied to the surface of the imaging sheet and, accordingly, must be adjusted to give optimal development. Typically, the pile on a magnetic brush is set to range from 0.0001 to 0.0625 inches larger than the gap.

For the imaging sheet 10 shown in FIGS. 2A and 2B which is normally utilized for transfer imaging, finely divided particles of a developer may be interspersed within the body of free particles 40. When the microcapsules in the unexposed areas 28 of the microcapsules 14 are ruptured, the finely divided developer mixes and interacts with the chromogenic material contained within or associated with the ruptured microcapsules to form an image. As an alternate method of applying the developer, it can be applied downstream of the free particle body by dusting or by application from a separate sump by means of a developer magnetic brush as will now be described with reference to FIG. 5.

A variety of imaging sheet development apparatuses can be designed in accordance with the present invention to provide any desired development speed. For example, one technique that can be used to increase the development speed is to use a plurality of magnetic brushes formed to present an extended traveling pile to an imaging sheet. A system can also be effected wherein one magnetic brush ruptures the microcapsules on the surface of an imaging sheet, with the imaging sheet then being transferred to a second magnetic brush which carries developer to the surface of the imaging sheet to complete the development. A developing system incorporating two independent magnetic brush systems with each magnetic brush system comprising a plurality of brush sleeves is shown in FIG. 5.

A first brush system 100 performs the function of rupturing microcapsules on the outer surface of an imaging sheet 102 secured to an imaging sheet carrier cylinder 104 which is rotated counterclockwise as indicated by the arrow 106 about an axis 108. A body of magnetically attractable free particles 110 is retained within a sump or trough 112 with the particles being mixed or agitated by stirrers 114 positioned within the trough 112. The magnetic brush 100 comprises three individual sleeves or magnetic brushes 116A–C which may be substantially the same as the magnetic brushes 30 shown in FIGS. 3 and 4. The magnetic brushes 116A–C are operated to effectively move or transport a pile 118 which engages an imaging sheet 102 secured to the carrier cylinder 104.

The length of the pile 118 on the magnetic brushes 116A–C is set by a trim blade or doctor blade 120 which trims the pile formed on the initial magnetic brush 116A. The magnetic brushes 116A–C are formed such that the pile 118 is carried from one to the other and is ultimately stripped from the magnetic brush 116C by a scraper blade 122 where the magnetically attractable free particles 110 are returned to the trough 112 and recirculated. The imaging sheet 102 is maintained on the image carriage cylinder 104 until the microcapsules on its surface have been ruptured by contact with the pile 118 traveling over the magnetic brushes 116A–C.

At this point, a stripper gate 124 is synchronously operated with the cylinder 104 to remove the imaging sheet 102 from the cylinder 104 and pass it to the second developer magnetic brush system 126. Preferably, the imaging sheet 102 is held to the cylinder 104 by means of one of a variety of well known vacuum systems such that the synchronization of the gate 124, the cylinder 104 and the vacuum system (not shown) pass the sheet 102 into a sheet transporting mechanism 128. In the illustrative embodiment, the sheet transporting mechanism comprises endless belts 130 and 132 entrained about rollers 134 such that the imaging sheet 102 is passed from the cylinder 104 to a developer cylinder 136 where it is again secured to its outer surface by means of a vacuum system (not shown).

The developer cylinder 136 rotates in the counterclockwise direction as indicated by an arrow 138 about an axis 140. The developer brush system 126 comprises a sump or trough 142 into which finely divided magnetically attractable particles of developer 144 are deposited. A triple magnetic brush system comprising magnetic brushes 146A, 146B and 146C operate in a manner similar to that of the brushes 116A–C of the magnetic brush system 100. The length of a pile 148 of traveling developer particles is determined by a trim or doctor blade 150 which is positioned adjacent to the first magnetic brush 146A. The magnetic brushes 146A–146C are made such that the pile travels from one brush to another and is ultimately removed from the final magnetic brush 146C by a scraper blade 152 with the magnetically attractable developer particles being returned to the sump 142 where they are agitated by stirrers 154. After the imaging sheet 102 has been sufficiently developed, it is removed from the developer cylinder 136, manually or by means of a sheet transporting arrangement (not shown) as will be apparent to those skilled in the art. The outer surfaces of the sleeves of the magnetic brush systems 30, 100 and 126 may be splinded, abraded or otherwise roughed to ensure that the pile formed on the sleeves travels with the cylinders rather than slipping therefrom.

It is apparent that a method and inexpensive apparatus have been disclosed for processing imaging sheets by means of magnetic brushes such that microcapsules on the imaging sheets are contacted by a traveling pile of magnetically attractable free particles formed on the surface of the magnetic brush to rupture the microcapsules either in the presence of a developer or with developer later being applied to the imaging sheets to thereby permit chromogenic material coating the sheets to interact with the developer and thereby develop latent images on the imaging sheets. While a variety of embodiments have been disclosed for performing magnetic brush abrasion of imaging sheets, many other arrangements will be apparent to those skilled in the art after a review of the above disclosure.

While the methods herein described and the forms of apparatus for carrying these methods into effect constitute preferred embodiments of this invention, it is to be understood that the invention is not limited to these precise methods and forms of apparatus and that changes may be made in either without departing from the scope of the invention which is defined in the appended claims.

What is claimed is:

1. A method of rupturing photosensitive microcapsules which form a photosensitive layer on the surface of an imaging sheet comprising the steps of:
    operating a magnetic brush such that a traveling pile of magnetically attractable free particles is formed on said magnetic brush; and
    passing an imaging sheet over said magnetic brush such that said traveling pile moves over said microcapsules on the surface of said sheet and thereby ruptures said microcapsules.

2. A method of rupturing microcapsules as claimed in claim 1 wherein the direction of travel of said pile and said imaging sheet are the same along the area of contact beteen said imaging sheet and said magnetic brush.

3. A method of rupturing microcapsules as claimed in claim 2 wherein the step of passing an imaging sheet over said magnetic brush comprises the steps of:
    mounting a cylinder for rotation in alignment with said magnetic brush and spaced a desired distance therefrom;
    securing said sheet to said cylinder; and
    rotating said cylinder to contact the microcapsules on the surface of said sheet with the traveling pile of free particles on said magnetic brush and thereby producing a shearing action which ruptures said microcapsules.

4. A method of rupturing microcapsules as claimed in claim 2 wherein the step of passing an imaging sheet over said magnetic brush comprises the steps of:
    providing a chute along and conformal with at least a portion of said magnetic brush; and
    inserting said sheet into said chute such that the microcapsules on the surface of said sheet contact the traveling pile of free particles on said magnetic brush and are ruptured by the shearing action produced thereby.

5. Apparatus for rupturing photosensitive microcapsules which form a photosensitive layer on the surface of an imaging sheet comprising:
    a body of magnetically attractable free particles;
    magnetic brush means operably engaged with said body of free particles for forming a moving pile of said free particles over said magnetic brush means; and
    sheet handling means operably positioned relative to said magnetic brush means for passing an imaging sheet over said magnetic brush means such that said moving pile engages said microcapsules on the surface of said imaging sheets with a soft, pliable brushing action and thereby ruptures said microcapsules.

6. Apparatus for rupturing microcapsules as claimed in claim 5 wherein said magnetic brush means comprises:
    at least one non-magnetic sleeve engaging said body of free particles;
    a magnetized device disposed within said sleeve; and
    drive means for producing relative movement between said magnetized device and said sleeve.

7. Apparatus for rupturing microcapsules as claimed in claim 6 wherein said sheet handling means comprises:
    a cylinder mounted for rotation in alignment with said magnetic brush means and spaced a desired distance therefrom;
    sheet stabilizing means for securing said sheet to said cylinder; and
    drive means for rotating said cylinder whereby the microcapsules on the surface of said sheet are contacted with the moving pile of free particles on said magnetic brush means and thereby are ruptured by the shearing action produced.

8. Apparatus for rupturing microcapsules as claimed in claim 6 wherein said sheet handling means comprises chute means for forming a channel along and conforming with at least a portion of said magnetic brush means whereby said sheet may be inserted into said chute means such that the microcapsules on the surface of said sheet contact the moving pile of free particles on said magnetic brush means and thereby are ruptured by the shearing action produced, said magnetic brush means serving to transport said imaging sheet through said chute means.

9. Apparatus for rupturing microcapsules as claimed in claim 5 wherein said magnetic brush means comprises a plurality of magnetic brushes.

10. In an imaging system in which images are formed by image-wise reaction of one or more chromogenic materials and a developer utilizing an imaging sheet having a coating containing a chromogenic material and a photosensitive composition, said photosensitive composition and said chromogenic material being encapsulated in rupturable microcapsules as an internal phase, a method of developing a latent image formed on said imaging sheet by image-wise exposure of said sheet to actinic radiation comprising the steps of:
    operating a magnetic brush such that a traveling pile of magnetically attractable free particles is formed on said magnetic brush; and
    passing an imaging sheet over said magnetic brush in the presence of a developer such that the relative motion between the imaging sheet and the traveling pile ruptures said microcapsules in the image areas whereby said microcapsules release said internal phase and said chromogenic material interacts with said developer.

11. A method of developing a latent image as claimed in claim 10 further comprising the step of carrying said developer on said free particles.

12. A method of developing a latent image as claimed in claim 10 further comprising the step of providing said developer as a coating on said imaging sheet.

13. In an imaging system in which images are formed by image-wise reaction of one or more chromogenic materials and a developer utilizing an imaging sheet having a surface coating containing a chromogenic material and a photosensitive composition, said photosensitive composition and said chromogenic material being encapsulated in rupturable microcapsules as an internal phase, a method of developing a latent image formed on said imaging sheet by image-wise exposure of said sheet to actinic radiation comprising the steps of:

operating a magnetic brush such that a traveling pile of magnetically attractable free particles is formed on said magnetic brush;

passing an imaging sheet over said magnetic brush such that said traveling pile moves over said microcapsules on the surface of said sheet and thereby ruptures said microcapsules; and applying said developer to said imaging sheet at a developer station positioned downstream from said magnetic brush whereby said microcapsules release said internal phase and said chromogenic material interacts with said developer to deveop said latent image.

14. A method of developing a latent image as claimed in claim 13 wherein said step of applying a developer to said imaging sheet comprises the steps of:

operating a developer magnetic brush such that a traveling pile of magnetically attractable particles carrying a developer material is formed on said developer magnetic brush; and passing said imaging sheet over said developer magnetic brush after rupturing said microcapsules on said imaging sheet.

15. In an imaging system in which images are formed by image-wise reaction of one or more chromogenic materials and a developer utilizing an imaging sheet having a coating containing a chromogenic material and a photosensitive composition, said photosensitive composition and said chromogenic material being encapsulated in rupturable microcapsules as an internal phase, apparatus for developing a latent image formed on said imaging sheet by image-wise exposure of said sheet to actinic radiation comprising:

a body of magnetically attractable free particles;

magnetic brush means operably engaged with said body of free particles for forming a moving pile of said free particles over said magnetic brush means; and sheet handling means operably positioned relative to said magnetic brush means for passing an imaging sheet over said magnetic brush means in the presence of a developer such that said moving pile engages said microcapsules on the surface of said imaging sheet with a soft, pliable brushing action and thereby ruptures said microcapsules to release said internal phase such that said chromogenic material interacts with said developer.

16. In an imaging system in which images are formed by image-wise reaction of one or more chromogenic materials and a developer utilizing an imaging sheet having a coating containing a chromogenic material and a photosensitive composition, said photosensitive composition and said chromogenic material being encapsulated in rupturable microcapsules as an internal phase, apparatus for developing a latent image formed on said imaging sheet by image-wise exposure of said sheet to actinic radiation comprising:

a body of magnetically attractable free particles;

magnetic brush means operably engaged with said body of free particles for forming a moving pile of said free particles over said magnetic brush means;

sheet handling means operably positioned relative to said magnetic brush means for passing an imaging sheet over said magnetic brush means such that said moving pile engages said microcapsules with a soft, pliable brushing action and thereby ruptures said microcapsules;

a body of particles carrying said developer;

developer magnetic brush means operably engaged with said body of particles for forming a moving pile of said particles carrying said developer over said developer magnetic brush means, said sheet handling means further providing for passing said imaging sheet over said developer magnetic brush means after said microcapsules have been ruptured such that said moving pile of said particles is applied to said imaging sheet whereby said chromogenic material interacts with said developer to develop said latent image.

\* \* \* \* \*